United States Patent [19]

Kouba

[11] Patent Number: 4,477,738
[45] Date of Patent: Oct. 16, 1984

[54] LSSD COMPATIBLE CLOCK DRIVER

[75] Inventor: Daniel J. Kouba, Manassas, Va.
[73] Assignee: IBM Corporation, Armonk, N.Y.
[21] Appl. No.: 387,990
[22] Filed: Jun. 14, 1982
[51] Int. Cl.³ .................... H03K 5/13; G01R 31/02
[52] U.S. Cl. .................... 307/445; 307/480; 307/582; 307/269; 324/73 R
[58] Field of Search ............ 307/470, 480, 445, 241, 307/244, 582, 269; 324/73 R

[56] References Cited

U.S. PATENT DOCUMENTS

| | | | |
|---|---|---|---|
| 3,769,525 | 10/1973 | Foss et al. | 307/241 |
| 3,815,025 | 6/1974 | Jordan | 324/73 R |
| 3,882,390 | 5/1975 | Lucas | 324/73 R |
| 3,965,459 | 6/1976 | Spencer et al. | 307/241 |
| 4,035,663 | 7/1977 | Stodola | 307/480 |
| 4,241,307 | 12/1980 | Hong | 324/73 R |
| 4,286,173 | 8/1981 | Oka et al. | 307/440 |
| 4,315,167 | 2/1982 | Pelc | 307/445 |

*Primary Examiner*—Stanley D. Miller
*Assistant Examiner*—B. P. Davis
*Attorney, Agent, or Firm*—John E. Hoel

[57] ABSTRACT

A cross-coupled, latch-type clock driver circuit is disclosed which enables the carrying out of level sensitive scan design (LSSD) testing. During normal operation, the circuit functions to prevent a pair of input clock waveforms from overlapping. This is achieved by applying a low state to a control signal input which causes the circuit to perform a latching operation on the input clock waveforms by providing a conductive cross-coupled connection between a first and second NOR Logic elements connected to the input clock waveforms. Then the outputs of the NOR elements will be insured to be nonoverlapping. During the test mode, the input clock waveforms must not be latched, in order for LSSD testing to be carried out. This is achieved by applying a high state to the control signal input, which disables the cross-coupled connection between the NOR logic elements. The circuit then becomes transparent to the input clock waveforms, enabling testing operations to be performed. The transition of the circuit from its normal mode to its test mode is carried out with a staged delay operation to prevent inadvertent current surges.

10 Claims, 4 Drawing Figures

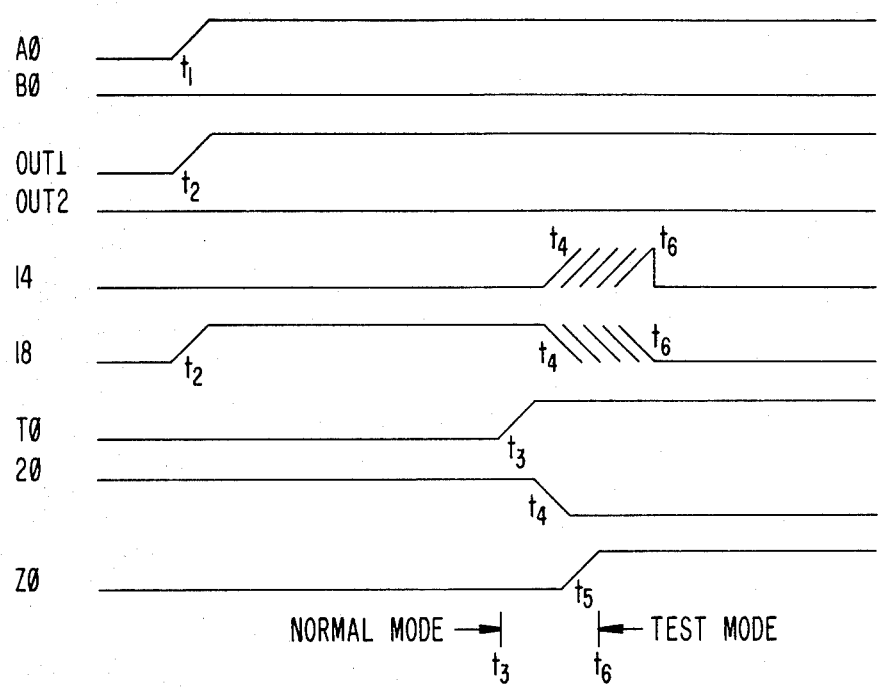

LSSD COMPATIBLE CLOCK DRIVER

FIELD OF THE INVENTION

The invention disclosed broadly relates to clocking circuits and more particularly relates to a level sensitive scan design compatible clock driver circuit.

BACKGROUND OF THE INVENTION

Problems arise in the carrying out of level sensitive scan design (LSSD) techniques for testing integrated circuits having cross-coupled, latch-type clock driver circuits. In the test mode, the clock driver's latching function must be transparent to the test inputs so that the internal shift circuitry can be tested during the LSSD testing techniques. LSSD testing techniques have been described, for example, in U.S. Pat. No. 3,761,695 to E. D. Eichelberger, assigned to the instant assignee.

Attempts have been made in the past to provide logic circuits which are selectively transparent or which can be bypassed under certain conditions. For example, U.S. Pat. No. 4,286,173 to Oka, et al. discloses logic circuit inputs to a logic block, which can bypass the logic block by selectively turning on a control line to enable a first AND gate and disable the AND gate. Other attempts to selectively bypass logic circuits include those described in U.S. Pat. Nos. 4,241,307; 3,882,390; and 3,815,025. However none of these examples of prior art provides a selectively transparent clock driver latching circuit which is compatible with level sensitive scan design testing techniques.

OBJECTS OF THE INVENTION

It is therefore an object of the invention to provide a latching clock driver circuit which is selectively transparent so as to be compatible with level sensitive scan design testing techniques.

SUMMARY OF THE INVENTION

These and other objects, features and advantages of the invention are accomplished by the clock driver circuit disclosed herein. A cross-coupled, latch-type clock driver circuit is disclosed which enables the carrying out of level sensitive scan design (LSSD) testing. During normal operation, the circuit functions to prevent a pair of input clock waveforms from overlapping. This is achieved by applying a low state to a control signal input which causes the circuit to perform a latching operation on the input clock waveforms by providing a conductive cross-coupled connection between a first and second NOR logic elements connected to the input clock waveforms. Then the outputs of the NOR elements will be insured to be non-overlapping. During the test mode, the input clock waveforms must not be latched, in order for LSSD testing to be carried out. This is achieved by applying a high state to the control signal input, which disables the cross-coupled connection between the NOR logic elements. The circuit then becomes transparent to the input clock waveforms, enabling testing operations to be performed. The transition of the circuit from its normal mode to its test mode is carried out with a staged delay operation to prevent inadvertent current surges.

DESCRIPTION OF THE FIGURES

These and other objects, features and advantages of the invention will be more fully appreciated with reference to the accompanying figures.

FIG. 4 is a waveform diagram illustrating the transition of the circuit from its normal mode of FIG. 2 to its testing mode of FIG. 3.

DISCUSSION OF THE PREFERRED EMBODIMENT

A cross-coupled, latch-type clock driver circuit is disclosed which enables the carrying out of LSSD testing. During normal operation, the signal T0 is low and therefore the inverter 5 applies a positive signal to the gates of the FET devices 6 and 7 so that a conductive cross-coupled connection between the NOR 2 and NOR 4 is maintained. During the test mode, T0 is high, which disables the cross-coupled connection between the NOR 2 and the NOR 4. Thus, the cross-coupled, latch-type clock driver circuit of FIG. 1, operates in accordance with the logic diagram of FIG. 2, during the normal mode but can be converted to a transparent circuit element as illustrated in FIG. 3 for the test mode.

Figure 1:
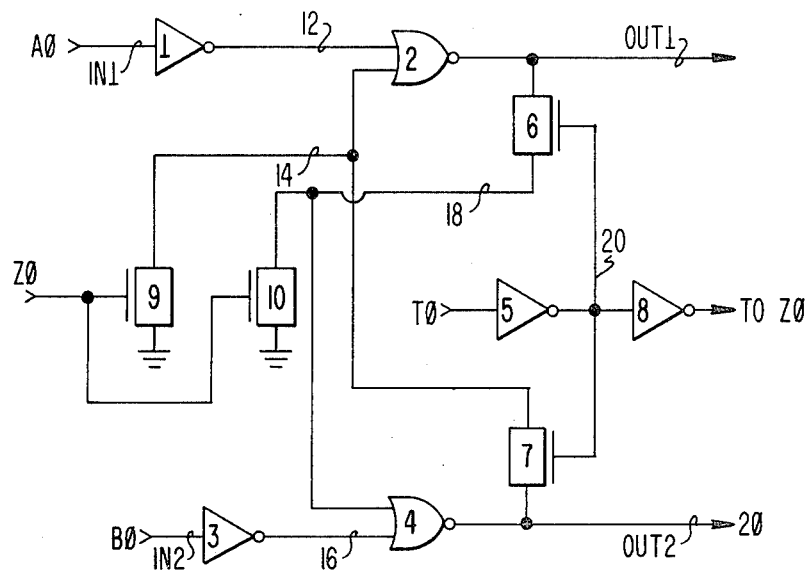
FIG. 1 is a schematic diagram of the LSSD compatible clock driver invention.
Figure 2:
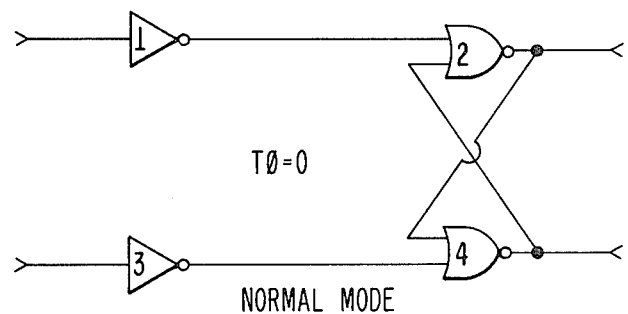
FIG. 2 is a schematic diagram of the invention of FIG. 1, as it functions in the normal mode.
Figure 3:
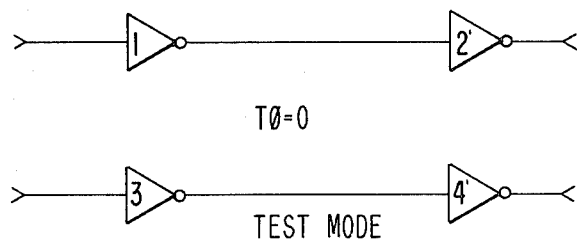
FIG. 3 is a schematic diagram of the invention of FIG. 1, as it functions in the testing mode.

The clock driver circuit of FIG. 1 is capable of selectively assuming a normal operational mode, as is shown in FIG. 2, for latching at a first and second circuit outputs OUT 1 and OUT 2, the signal state of two clock waveforms A0 and B0 at a first and a second circuit inputs IN 1 and IN 2 in normal applications. The clock driver circuit of FIG. 1 can alternately assume a testing mode as is shown in FIG. 3, for transferring the clock waveforms from the inputs to the outputs during testing applications. In the following description, FET devices will be of the N channel type which are made conductive by a positive gate-to-source potential. However, P channel FET devices could be employed and opposite polarity signals used.

The circuit of FIG. 1 includes a first NOR gate 2 which has a first input 12 connected to the first circuit input IN 1 through the inverter 1, a second input 14, and an output connected to the first circuit output OUT 1.

A second NOR gate 4 has a first input 16 connected to a second circuit input IN 2 through an inverter 3, a second input 18, and an output connected to the second circuit output OUT 2.

A first FET switching device 6 is connected between the output of the first NOR gate 2 and the second input 18 of the second NOR gate 4, and has a control terminal connected to a control input T0 through inverter 5, for selectively applying the output of the first NOR gate 2 to the second input 18 of the second NOR gate 4.

A second FET switching device 7 is connected between the output of the second NOR gate 4 and the second input 14 of the first NOR gate 2, and has a control terminal connected to the control input T0 through the inverter 5, for selectively applying the output of the second NOR gate 4 to the second input 14 of the first NOR gate 2.

In the normal mode of operation, the first and second FET switching devices 6 and 7 are conductive when the control input T0 is in a low state, applying a high signal to the gates of devices 6 and 7. This causes the first and second NOR gates 2 and 4, respectively, to be cross-coupled and latch the signal state of the two clock waveforms in the normal operational mode of FIG. 2.

When LSSD testing is to be performed, the test mode is enabled by making the first and second FET switching devices 6 and 7 nonconductive when the control input T0 is in a high state, applying a low signal to the gates of devices 6 and 7. This interrupts the cross-coupling between NORs 2 and 4 making the latching function transparent to the clock inputs, as shown in FIG. 3.

The transition from normal mode to test mode must be made in an orderly fashion to prevent undesired current surges in the circuit. This is achieved by means of connecting the input of the inverter 8 to the gates of FET devices 6 and 7, so as to serve as a delay element. The output of inverter 8 is connected to the gates of FET devices 9 and 10. FET device 9 has its source/drain path connected between ground potential and the input 14 of NOR 2. FET device 10 has its source/drain path connected between ground potential and the input 18 of NOR 4. A positive output from inverter 8 will cause FET devices 9 and 10 to conduct, grounding the respective inputs 14 and 18 of NORs 2 and 4, making each NOR 2 and 4 function as a simple inverter, depicted as 2′ and 4′, respectively, in FIG. 3. It can be seen that if the inputs 14 and 18 of the NORs 2 and 4 were grounded while FET devices 6 and 7 were still conductive, a current surge would occur from the outputs of the NORs 2 and 4 to ground. This is avoided by the delay function provided by the inverter 8, which enables the signal to turn off FET devices 6 and 7 before FET devices 9 and 10 are turned on. This orderly transition is important because usually an integrated circuit to be tested will be initially powered-up in its normal mode and then the transition is made to the test mode. After testing is completed, the integrated circuit is usually powered down and the test results evaluated. Without the orderly transition provided by the subject circuit invention, a serious current surge could result in erroneous test results.

In this manner, the circuit can be selectively adapted to operate in either the normal mode for normal data applications or in the testing mode for LSSD testing applications.

The problem of selectively carrying out LSSD testing techniques for integrated circuits having cross-coupled, latch-type clock driver circuits, is solved by the invention, which carries out cross-coupled, latch-type clock driver functions during normal operational modes but which is transparent to the clock pulses during LSSD testing modes.

OPERATION OF THE INVENTION

Reference to FIG. 4 will illustrate the waveform diagram showing the transition of the circuit from its normal mode of FIG. 2 to its testing mode of FIG. 3.

As can be seen in FIG. 4, the A0 waveform is the data signal at the input IN 1 and the B0 waveform is the data input to IN 2. In realistic system environments, the waveforms A0 and B0 may not always be non-overlapping waveforms, and yet the shift register circuits which are to be driven by the A0 and B0 clocking waveforms require non-overlapping clock signals. The latching clock driver circuit of FIG. 1, when operated in its normal mode, serves to guarantee that the output signals OUT 1 and OUT 2 are always non-overlapping, to satisfy the requirement for clocking shift registers connected to those outputs. As may be seen in FIG. 4, the waveform A0 rises from a low state to a high state at the time $t_1$. The inverter 1 and the NOR gate 2 apply a slight delay to the input signal A zero so that the output signal OUT 1 begins to rise at the later time $t_2$, as is shown in FIG. 4. Since the circuit of FIG. 1 is operating in its normal mode, the control signal T0 is at a low state, as is shown in FIG. 4, and therefore the waveform 20 at the output of the inverter 5 is at a high state, maintaining the FET devices 6 and 7 in their conductive modes. Thus, as the output signal OUT 1 transitions from its low state to its high state, the line 18 shown in FIG. 1 also transitions at time $t_2$ from its low state to its high state, as is shown in FIG. 4. The rising transition on line 18 provides a high state signal to one of the inputs of the NOR gate 4, thereby guaranteeing that the output state for the second output OUT 2 will be low. This condition will remain in effect without regard for the state of the second input waveform B0 at IN 2, thereby guaranteeing the non-overlapping waveforms required for OUT 1 and OUT 2.

At the time $t_3$, it is desired to begin the transitional state from the normal mode of operation to the test mode of operation, in order to enable the circuit of FIG. 1 to be transparent to test signals which are to be input on the input nodes IN 1 and IN 2. Thus, at time $t_3$, the control signal T0 transitions from its low state to its high state, as is shown in FIG. 4 and, after a slight delay imposed by the inverter 5, the node 20 begins to fall at time $t_4$, from its high state to a low state. As the waveform on line 20 begins to fall, the FET devices 6 and 7 are rendered nonconductive and thus the lines 18 and 14 transition into an indeterminant state starting at approximately time $t_4$.

After a delay imposed by the inverter 8 of FIG. 4, from the time $t_4$ to the time $t_5$, the node Z0 begins to rise and at approximately the later time $t_6$, the waveform Z0 will turn on the FET devices 9 and 10 shown in FIG. 1, thereby insuring that lines 14 and 18 are not connected to ground potential until the FET devices 6 and 7 are fully off.

In this manner, spurious testing signals which might occur due to inadvertent current surges from the output node of the NOR gate 2 through the FET device 6 on line 18, through the FET device 10 to ground potential or alternately from the output node of the NOR gate 4 through the FET device 7 over the line 14 and through the FET device 9 to ground potential, are intentionally prevented by the staged delay operation of the inverters 5 and 8 connected to the node 20 and the node Z0, as is shown in FIG. 1.

Although a specific embodiment of the invention has been disclosed, it will be understood by those of skill in the art that the foregoing and other changes in form and details may be made therein without departing from the spirit and the scope of the invention.

Having thus described our invention, what we claim as new, and desire to secure by Letters Patent is:

1. A clock driver circuit capable of selectively assuming a first operational mode for latching at a first and a second circuit outputs the signal state of two clock waveforms at a first and a second circuit inputs in normal applications and alternately assuming a second operational mode for transferring said clock waveforms from said inputs to said outputs, during testing applications, comprising:

a first NOR gate having a first input connected to said first circuit input, a second input and an output connected to said first circuit output;

a second NOR gate having a first input connected to said second circuit input, a second input and an output connected to said second circuit output;

a first switching device connected between said output of said first NOR gate and said second input of said second NOR gate, and having a control terminal connected to a control input, for selectively applying said output of said first NOR to said second input of said second NOR;

a second switching device connected between said output of said second NOR gate and said second input of said first NOR gate, and having a control terminal connected to said control input, for selectively applying said output of said second NOR to said second input of said first NOR;

said first and second switching devices being conductive when said control input is in a first state, causing said first and second NOR gates to be cross-coupled and latch said signal state of said two clock waveforms in said first operational mode, said first and second switching devices being nonconductive when said control input is in a second state;

a delay device having an input connected to said control input and an output connected to said second input of said first NOR gate and connected to said second input of said second NOR gate, for conditioning said first NOR gate to transfer said first clock waveform from said first circuit input to said first circuit output and for conditioning said second NOR gate to transfer said second clock waveform from said second circuit input to said second circuit output when said control input is in said second state selectively causing said second operational mode to occur;

whereby said circuit can be selectively adapted to operate in either said normal applications or said testing applications.

2. The circuit of claim 1 wherein said first switching device is a first field effect transistor having its source/drain path connected between said output of said first NOR gate and said second input of said second NOR gate, and having its gate as said control terminal thereof.

3. The circuit of claim 2, which further comprises:
said second switching device being a second field effect transistor device having its source/drain path connected between said output of said second NOR gate and said second input of said first NOR gate and having its gate connected as the control terminal thereof.

4. The circuit of claim 1 wherein said delay device is a pair of inverters, the first inverter having an input connected to said control input and having an output connected to said control terminal of said first and second switching devices, and a second inverter thereof having an input connected to said output of said first inverter and an output connected to said second input of said first NOR gate and connected to said second input of said second NOR gate.

5. A clock driver circuit capable of selectively assuming a first operational mode for latching at a first and a second circuit outputs the signal state of two clock waveforms at a first and a second circuit inputs in normal applications and alternately assuming a second operational mode for transferring said clock waveforms from said inputs to said outputs, during testing applications, comprising:

a first NOR gate having a first input connected to said first circuit input, a second input and an output connected to said first circuit output;

a second NOR gate having a first input connected to said second circuit input, a second input and an output connected to said second circuit output;

a first switching device connected between said output of said first NOR gate and said second input of said second NOR gate, and having a control terminal connected to a control input, for selectively applying said output of said first NOR to said second input of said second NOR;

a second switching device connected between said output of said second NOR gate and said second input of said first NOR gate, and having a control terminal connected to said control input, for selectively applying said output of said second NOR to said second input of said first NOR;

said first and second switching devices being conductive when said control input is in a first state, causing said first and second NOR gates to be cross-coupled and latch said signal state of said two clock waveforms in said first operational mode, said first and second switching devices being nonconductive when said control input is in a second state;

a third switching device connected between said second input of said first NOR gate and a reference potential, and having a control terminal, for selectively disabling said second input of said first NOR gate in response to a signal input on said control terminal thereof;

a fourth switching device connected between said second input of said second NOR gate and said reference potential, and having a control terminal, for selectively disabling said second input of said second NOR gate in response to a signal input on said control terminal thereof;

a delay device having an input connected to said control input and an output connected to said control terminal of said third switching device and connected to said control terminal of said fourth switching device, for rendering said first and second switching devices nonconductive before said third and fourth switching devices are rendered conductive, thereby conditioning said first NOR gate to transfer said first clock waveform from said first circuit input to said first circuit output and for conditioning said second NOR gate to transfer said second clock waveform from said second circuit input to said second circuit output when said control input is in said second state selectively causing said second operational mode to occur in a controlled manner;

whereby said circuit can be selectively adapted to operate in either said normal applications or said testing applications.

6. The circuit of claim 5 wherein a second inverter is connected between said input of said first inverter and said control input.

7. The circuit of claim 5 wherein said first switching device is a field effect transistor having its source/drain path connected between said output of said first NOR gate and said second input of said second NOR gate.

8. The circuit of claim 7 wherein said second switching device is a field effect transistor having its source/drain path connected between said output of said second NOR gate and said second input of said first NOR gate and having its gate connected to said control input.

9. The circuit of claim 8 wherein said third switching device is a field effect transistor having its source/drain path connected between said second input of said first NOR gate and a reference potential, and having its gate connected to said output of said delay device.

10. The circuit of claim 9 wherein said fourth switching device is a field effect transistor device having its source/drain path connected between said second input of said second NOR gate and said reference potential, and having its gate connected to said output of said delay device.

* * * * *